United States Patent [19]
Buhl et al.

[11] Patent Number: 5,215,640
[45] Date of Patent: Jun. 1, 1993

[54] METHOD AND ARRANGEMENT FOR STABILIZING AN ARC BETWEEN AN ANODE AND A CATHODE PARTICULARLY FOR VACUUM COATING DEVICES

[75] Inventors: Rainer Buhl, Sargans; Christoph Hasler, Azmoos, both of Switzerland

[73] Assignee: Balzers AG, Liechtenstein

[21] Appl. No.: 422,581

[22] Filed: Oct. 17, 1989

Related U.S. Application Data

[63] Continuation-in-part of Ser. No. 151,470, Feb. 2, 1989, abandoned.

[30] Foreign Application Priority Data

Feb. 3, 1988 [CH] Switzerland ............... 00403/87

[51] Int. Cl.⁵ ............................................. C23C 14/24
[52] U.S. Cl. ........................ 204/192.38; 204/298.41; 427/580
[58] Field of Search ........ 204/298 D, 298 TS, 192.38, 204/298.12, 298.41; 427/37

[56] References Cited

U.S. PATENT DOCUMENTS

| | | | |
|---|---|---|---|
| 3,625,848 | 12/1986 | Chow et al. | |
| 3,783,231 | 1/1974 | Sablev et al. | 204/298 |
| 3,793,179 | 2/1974 | Sablev et al. | 204/298 |
| 4,392,932 | 7/1983 | Harra | |
| 4,492,845 | 1/1985 | Kljuchko et al. | 204/298 |
| 4,559,125 | 12/1985 | Mularie | 204/298 |
| 4,600,489 | 7/1986 | Lefkow | 204/192.38 |
| 4,620,913 | 11/1986 | Bergman | 204/192.38 |
| 4,929,322 | 5/1990 | Sue et al. | 204/298.41 X |

FOREIGN PATENT DOCUMENTS

| | | |
|---|---|---|
| 1953659 | 10/1969 | Fed. Rep. of Germany . |
| 2214590 | 3/1972 | Fed. Rep. of Germany . |
| 2136532 | 2/1973 | Fed. Rep. of Germany . |
| 3125736C2 | 5/1985 | Fed. Rep. of Germany . |
| 3345442C2 | 1/1986 | Fed. Rep. of Germany . |

*Primary Examiner*—Nam X. Nguyen
*Attorney, Agent, or Firm*—McGlew and Tuttle

[57] ABSTRACT

A shield to limit an electric arc discharge between an anode and a cathode to a designated portion of the cathode surface is fashioned in the shape of a limiting ring with good electrically conducting surface, e.g., copper or aluminum, surrounding this surface. Application of the invention, especially with heavy current arc discharges causes the tracing point of the discharge to move stochastically back and forth on the cathode.

22 Claims, 2 Drawing Sheets

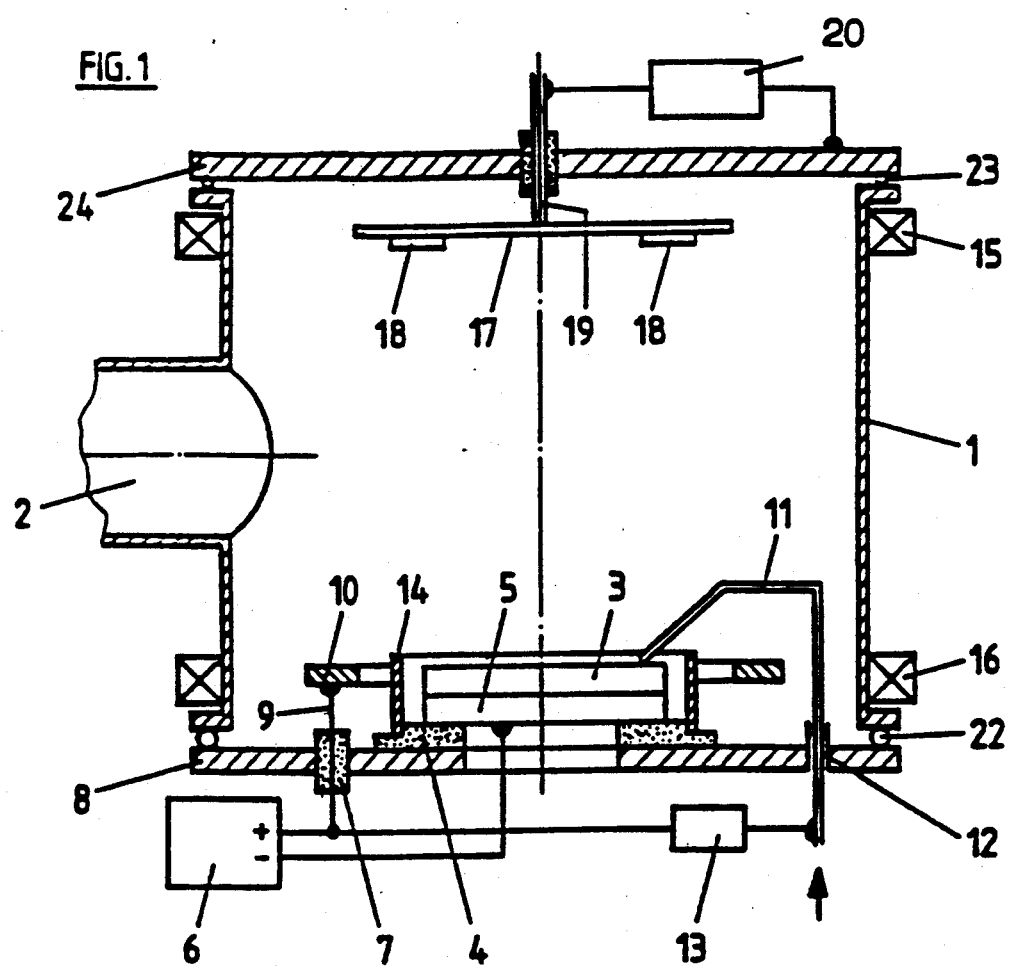

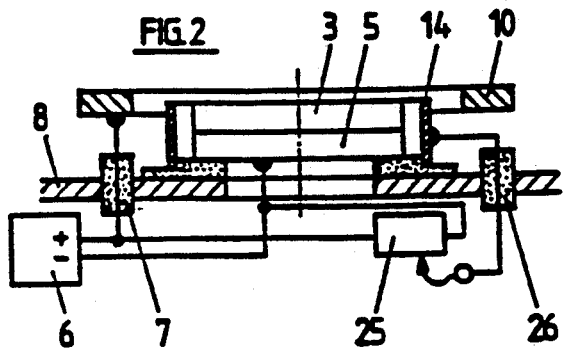
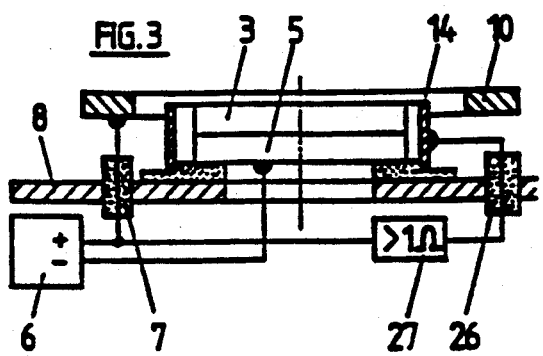
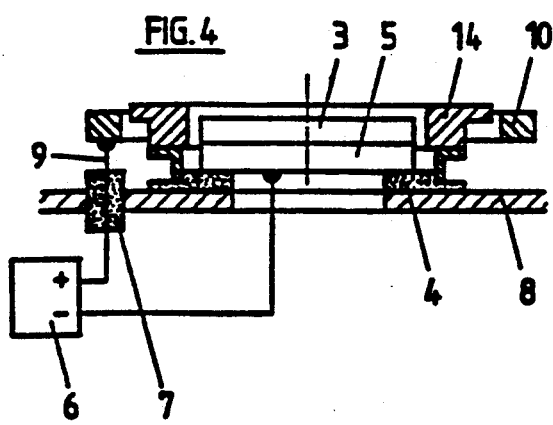
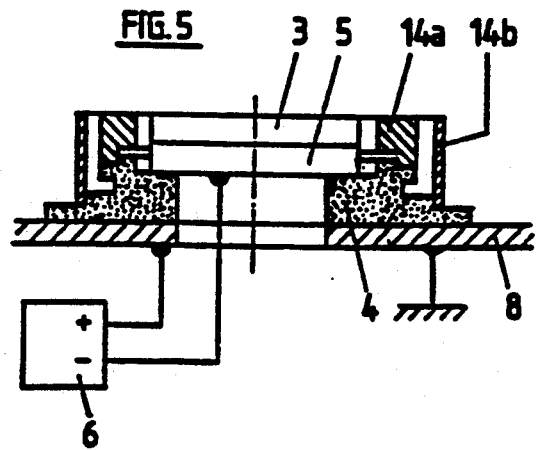

METHOD AND ARRANGEMENT FOR STABILIZING AN ARC BETWEEN AN ANODE AND A CATHODE PARTICULARLY FOR VACUUM COATING DEVICES

RELATED CASE INFORMATION

This is a continuation-in-part of application Ser. No. 151,470, filed Feb. 2, 1989 abandoned.

FIELD OF THE INVENTION

This invention relates, in general, to the coating of materials and, in particular, to a new and useful method and arrangement for stabilizing an arc between an anode and a cathode in a vacuum coating device through electronic arc discharge.

BACKGROUND OF THE INVENTION

Since the application of electric arc discharges between an anode and a cathode as vaporization sources or as a means to generate ions of solids, it has been desirable to confine the vapor and the ion emission to a definite region of the cathode, specifically, the region from which the emitted molecules of vapor or ions can be optimally utilized. Because the material to be evaporated, or ionized, only exists in suitable composition for an intended application in this particular region; (we may think of the vacuum metallization of alloys, for example) the emission of the particles for geometrical considerations should only obtain from a definite region of the cathode, in order to deposit the substrates only under certain directions of incidence, for example, or to prevent the exposure of certain parts of the facility in a deposition layout. Finally, in each instance it is necessary to make sur that the electric arc cannot extend far enough at the rim of the cathode to damage the cathode mounting or other parts of the facility. This has represented a problem, especially when a component that is electrically positive relative to the cathode or that is entirely connected to the anode potential and was situated in the vicinity of the cathode. This case is the so-called tracing point of the arc discharge, which normally wanders in fits and starts back and forth from one point to another on the cathode surface. The tracing point might be stabilized in the proximity of such component and heat the latter too intensely by virtue of too long a burning time at the particular point, so that the component or the cathode mounting would be damaged. In order to deter this, various measures have already been proposed to confine the motion of the tracing point of an arc discharge to a preselected region of the cathode surface. However, these measures currently have brought only some success in cases when the discharge produces only a single tracing point at not too high a current intensity. But if several tracing points begin to form in the case of more intense discharges of around 50 amperes or more of total current intensity (which on the basis of the present experience cannot be avoided), the problem can no longer be mastered by the known measures.

In British patent No. 1,322,670 and the corresponding U.S. Pat. No. 3,793,179, it is proposed to provide a means of extinguishing the tracing point of an arc discharge as soon as the latter emerges from the permissible region of the cathode surface. For this purpose, shielding plates were arranged as close as possible, e.g., at a distance of a couple of millimeters, in front of the portions of surfaces to be protected against the discharge, which surrounded the outer perimeter of the cathode in the form of ring. Evidently, these rings could be made of any desired material, that is, either an electrically conducting material or an insulator. To be sure, only shields of magnetizable material, and especially a soft magnetic material, such as an appropriate steel, were recommended for use, as it was purportedly observed that use of a shield of different material unfavorably influenced the stability of the arc discharge.

In this respect, (10 years after publication of the aforesaid proposal, by a different party German patent No. 33 45 442), it was again recommended to employ a limiting ring of magnetically permeable (soft magnetic) material, in particular, one such as soft iron or the alloy Permalloy, for the purpose of limiting the cathode spot on the target surface in a device for stabilization of a vaporization arc. This was supposed to deflect the arc back to the target surface whenever it approached the limiting ring. Other materials said to be suitable for such limiting ring, besides iron, were nickel and cobalt or alloys thereof. But the important point, as stressed, was that the limiting ring should be magnetically permeable, in order to hold the arc on the target surface by virtue of this property.

All of these familiar measures for preventing the arc from wandering out of a permitted region of the cathode surface were sufficient (particularly) for an arc with only one tracing point of the discharge. But at overall current intensity of the arc approximately 50 amperes or higher, multiple tracing points (cathode points, "cathode spots") form in increasing measure, and experience reveals that the materials hitherto recommended as the optimal solution for the limiting rings fail in this case. In fact, it was found that, when several discharge tracing points occur, the arc can abruptly occupy a position outside the permitted cathode region (i.e., no longer wander back and forth on the cathode surface), so that damage may occur in this location, in particular, burn-through of the cathode and its cooled supporting base.

The reason for this statistically occurring defect is not entirely clear, but evidently a sizable portion of the total arc current intensity is concentrated at this instant on a tracing point located in a forbidden position, whereupon the limiting ring can no longer perform its intended function, i.e., it is no longer able to turn away the arc from touching the margin.

In any case, it is continually observed that, when the current intensity is greater than 50 amperes, despite the partitioning of the total current into several separate arcs which occur, and which would lead one to suppose that the individual discharge branch does not carry too large a current density, nevertheless damages occurs that could still have been prevented by the previously known magnetizable limiting rings of soft magnetic material in the case of discharges with only one tracing point.

In the quest for additional possibilities of stabilizing an evaporation arc, German patent 33 45 493 propounded the use of a limiting ring that is in contact with the target and surrounds the target surface, while this limiting ring should consist of a material having a secondary electron emission ratio smaller than 1 for average energies of the charged particles of the arc, and in order to confine the cathode spot on the target surface it should have a surface energy smaller than that of the evaporated target material. In particular, it was proposed to use materials containing nitride compounds for the limiting rings, and in another version, a ring consisting of iron or Permalloy, in which case a layer with appropriate secondary electron emission ratio should also be deposited on the magnetically permeable ring, if need be.

In the case of a magnetically permeable ring, it had been observed that (if the target material itself is non-magnetic, at any rate), the arc wandering in random motions about the target surface dwells on one particular spot for approximately one second and then moves on to other zones of the cathode. From German patent 33 45 442, it can be deduced that limiting rings of magnetically permeable material should be used because, owing to their magnetic properties, they can hold the arc on a non-magnetic target. It was believed that a magnetically permeable material would be needed in order to create a sufficiently strong magnetic field by the discharge current.

The purpose of the limiting rings, as mentioned, is to confine the apparently aimless motion of the cathode points, which are the source of the particle emission in an arc discharge on a cold cathode, to the intended surface of the cathode. The ring of magnetizable material, heretofore regarded as the best solution, achieves this for discharges with only one tracing point, although the reliability with which it performs this function is no longer satisfactory when the cathode is operated at a higher arc current, so that several tracing points exist at the same time. Contrary to the prevailing view on the action of a magnetic field, this reliability is even further reduced if a magnetic field is provided normal to the cathode surface, in order for example to create suitable conditions for deposition of a layer on a substrate. Even if the arc current intensity is only moderately raised, so that only a few cathode points move simultaneously over the cathode surface, breakout of a cathode point takes place after a somewhat prolonged on-time, in any case, after several hours of operation. This may then move into disallowed regions, and propitious burn conditions will exist, for example in the neighborhood of insulators or other structural components, thereby causing damage. Hence, not even an occasional abandonment of the designated cathode surface can be tolerated in industrial operation.

SUMMARY OF THE INVENTION

The present invention provides an arrangement for the stabilization of an arc with the use of a limiting ring in such a way that reliable protection is afforded against breakout of the arc tracing points from the region of the cathode surface designated for the evaporation or the generation of ions, especially at high current strengths.

The present invention departs from the teachings discussed above in that no induction coil is actually employed to generate magnetic fields for control of the arc. Applicant's present invention instead relies on high surface conductivity of a limiting ring which may be formed of ring segments but which is not formed as a coil with a closed current loop in which a macroscopic current flows. Instead, applicant's non-coil has microscopic currents induced on its surface upon the approach of the electric arc to the highly conductive order.

The microscopic or small currents generated on the surface of the limiting ring or limiting member are generated by the magnetic field of the arc and result in a corresponding repellant magnetic field (by mutual induction) which builds up very quickly due to the high conductivity of the material and the very small length of the eddy-current loops. This is predominantly due to the small value of the resistance along the microscopic current loops.

The present invention provides an electric arc limiting arrangement which relies on high surface conductivity of a limiting ring which may be formed of ring segments but which is not formed of a coil. That is, no macroscopic current is allowed to flow in such limiting ring. Instead, the limiting ring of the invention has microscopic currents induced on its surface upon the approach of the electric arc to the highly conducting limiting ring.

The microscopic or small currents generated on the surface of the limiting ring or limiting member are generated by the magnetic field of the arc and result in a corresponding repellant magnetic field (by mutual induction) which builds up very quickly due to the high conductivity of the material and the very small length of the eddy-current loops. This is predominantly due to the small value of the resistance along the microscopic current loops.

With such an arrangement, a magnetic field may be induced into an enclosed current loop under the conditions that:

(a) with respect to such a loop the magnetic flux changes in time, (b) that the magnetic field provides for a magnetic flux through the loop.

A loop which is provided in a plane parallel to that of the magnetic field, will not enclose a magnetic flux caused from that magnetic field. A current loop which is positioned perpendicular to the magnetic field will be crossed by a magnetic flux. As the mark moves on the target, the change of the magnetic flux per unit of time, within such a perpendicular current loop, will be more significant, the more the arc approaches this current loop. The current loop perpendicular to the magnetic field lines of the arc current will not be realized within the bordering structure material if the bordering structure lies completely beyond the cathode surface (below) or even flush with the cathode surface. Accordingly, extending the bordering structure above the cathode surface, provides a structural arrangement which provides even further benefits as compared to the prior art.

The bordering structure according to the arrangement of the invention does no need to be isolated from the cathode. This is a significant advantage as compared with prior art arrangements. The bordering structure may be laid on the cathodic, or anodic or another electrical potential and such will not directly influence the magnetic field-induced eddy current repelling action. This will of course affect the process and may be selected according to other requirements. This also provides significant advantages over prior art arrangements.

Accordingly the arrangement of the invention provides a bordering structure, bordering the cathode, with a conductivity along its surface of at least $3 \times 10^5$ S/cm. Additionally, bordering structure extends above the surface of the cathode which is to be evaporated. This concept is clearly different from the normal generation of a macroscopic magnetic field using an induction coil with at least two windings.

According to the method of the invention, an electric arc is maintained on a on a preselected area of a cathode in a vacuum evaporation process, by:

positioning a non coil limiting ring about the cathode;

generating eddy current in the limiting ring, by the arc, as the arc approaches the limiting ring so as to repel the arc; and, minimizing the magnitude of the time for generating the eddy currents by providing the limiting ring with a surface having a conductivity of at least $3 \times 10^5$ S/cm. such that the reaction time of the eddy currents is adapted to the migration speed of the arc on the cathode.

In accordance with the invention, the limiting ring is arranged in electrical insulation with respect to the cathode surface, and the material has an electrical conductivity of at least $1.5 \times 10^5$ Ohm$^{-1}$ cm$^{-1}$ on its surface.

Apart from a sufficient electrical conductivity of the limiting ring, it is also of special importance that the ring not be in electrical contact with the target itself. It has been found that the invented solution affords much more reliable bounding off of the marginal surface of the cathode than is the case with the magnetically permeable ring, hitherto recommended as the optimum. This is especially so when several discharge tracing points are formed at high discharge current intensities. The explanation for this better effect is not entirely clear, but may possibly lie in the following:

Until now, it has been presumed that the limiting function relies on the fact that the strongest possible magnetic field must be generated by the arc approaching the limiting ring in order to drive the arc back from the ring into an interior zone of the cathode surface. To generate a sufficiently strong magnetic field by the discharge current, it seemed advisable to use a ring of magnetically permeable material, as this heightens the magnetic field strength. Only thus, it appeared, could a sufficient limiting effect be achieved.

On the contrary, the invention is based on the surprising fact that such strengthening effect by a magnetically permeable ring is by no means necessary, but instead—perhaps on account of the slow change in the magnetic field that may occur when using magnetically permeable (and usually also electrically conductive) material—the danger subsists of an arc moving fast toward the ring, reaching or even jumping over it, before the magnetic field is strengthened by the permeability of the ring material. In any case, it has been found that, by using a ring with a surface of suitably high electrical conductivity, the limiting effect of a limiting ring in accordance with the invention is substantially more reliable than could be achieved with the method heretofore regarded as optimal in the prevailing state of the art, at least in the event of high arc currents over 50 amperes, when the formation of several discharge tracing points is favored.

The explanation for the improved effectiveness of the invented arrangement, consequently, should perhaps be sought in the higher speed of magnetic field build up and break down.

As the material with good electrical conductivity for the limiting ring or the surface thereof, naturally, the well conducting metals and (for economical reasons) especially copper and aluminum come under consideration. The ring can be situated directly above the cathode surface, in which case the arc is then confined to the portion of the cathode surface bounded by the ring, or it can surround the cathode at close distance from the outer margin thereof, in which case the arc is prevented from leaving the cathode surface. The term ring in this description need not absolutely signify an annular ring. Rather, it may also refer to an oval ring, or even a closed framelike body, such as a rectangle. Moreover, the limiting ring of the invention may have different cross sections, for example, it may possess the shape of a flat disk or a cylindrical convex surface, as will emerge from the sample configurations described in the attached drawings.

Accordingly, it is an object of the invention to provide an arrangement for stabilizing an arc between an anode and a cathode, particularly in an electronic vacuum coating device which comprises a cathode which has a surface which receives the arc with at least one limiting ring with an electrically conductive surface surrounding the cathode and with electrical insulation disposed between the ring and the cathode surface and the apparatus and wherein the ring is of a material which exhibits an electrical conductivity of at least three times $10^5$ S/cm on its surface.

A further object of the invention is to provide a method of stabilizing an arc between an anode and a cathode, particularly in a vacuum coating device which comprises a positioning ring between a disc-shaped anode and a flat disc cathode wherein the ring is capable of having an electrical conductivity of at least three times $10^5$ S/cm (Siemens per centimeter where S=A/V or the inverse of the specific resistance) on its surface.

A further object of the invention is to provide a vacuum coating device and arrangement for stabilizing an arc which are simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the Drawings:

FIG. 1 is a sectional view of a vacuum deposition facility with an arrangement in which a limiting ring with cylindrical convex surface surrounds the cathode and in which an anode ring is also provided and an auxiliary mechanism for ignition of the discharge and constructed in accordance with the invention;

FIG. 2 is a partial sectional view of an arrangement in which the potential for the limiting ring is obtained by means of a potentiometer from the anode voltage.

FIG. 3 is a view similar to FIG. 2 of another embodiment of the invention in which the potential applied to the limiting ring is decreased with respect to the anode potential by the voltage drop across a resistance connected in series;

FIG. 4 is a view similar to FIG. 2 of still another embodiment in which the ring is no longer connected to a voltage source, but lies at a floating potential during operation; and FIG. 5 is a view similar to FIG. 2 of still another embodiment of the invention which shows two limiting rings in operation on a floating potential, in which case the inner wall of the vacuum chamber ca be hooked up as the anode.

DESCRIPTION OF THE PREFERRED EMBODIMENTS

Referring to the drawings, in particular, the invention embodied therein comprises an arrangement for stabilizing of an arc between an anode and a cathode 3, particularly in a vacuum coating device having a cylindrical vacuum deposition chamber 1. In accordance with the invention, the cathode has a surface which receives the arc and there is at least one limiting ring 14 disposed around the cathode 3. Electrical insulation is provided in the mounting of the cathode surface and it includes an insulator 4 which also supports the limiting ring 14. The limiting ring 14 is of a material which can have a conductivity of at least three times $10^5$ S/cm.

According to the method of the invention, an electric arc is maintained on a on a preselected area of a cathode 3 in a vacuum evaporation process, by positioning a non coil limiting ring 14 about the cathode 3 at a level above the level of the cathode surface. Eddy currents (microscopic currents) are then generated in the limiting ring, by the arc, as the arc approaches the limiting ring so as to repel the arc without current applied through the bordering structure. The magnitude of the time for generating the eddy currents (response time) is then minimized by providing the limiting ring 14 with a surface having a conductivity of at least $3 \times 10^5$ S/cm. such that the reaction time of the eddy currents is adapted to the migration speed of the arc on the cathode.

In FIG. 1, 1 designates a cylindrical vacuum deposition chamber, which can be evacuated through a pump evacuation opening 2. Arranged herein is a cathode 3, which is secured to the floor of the layout. The cathode rests on a base 5, which can carry away the accruing waste heat by a coolant circulating in its interior. The cooling base, in turn, is supported by insulators 4 and connected vacuum-tight to the receptacle. Furthermore, the cathode is connected to the negative pole of a current source 6, the positive pole of which is connected to a line 9, passing through a floor plate 8 of the layout by means of an insulator 7, to a ring-shaped disk 10, which is connected as the anode. It is advisable to have a so-called ignition finger 11 arranged at the cathode as an auxiliary appliance, which can be moved in the direction of the arrow by means of a vacuum-tight insulated activation appliance 12 passing through the chamber wall, so that the cathode can be touched with the ignition finger or the latter moved away from it. The maximum current flowing upon contact is limited to around 10 amperes by a resistance 13. The interruption spark created by lifting the ignition finger from the cathode then develops into the first of the tracing pints of the arc discharge.

According to the principals of the invention, the cathode 3 is surrounded by an insulated, cylindrical surface limiting ring 14, resting on the insulator 4, which prevents a wandering of the cathode points—in this case, to the cylindrical lateral wall of the cathode——and thus confines the motion of the latter to the front surface of the cathode.

Furthermore, coils 15 and 16 are provided—they may be hooked up as a Helmholtz couple—and have the effect of increasing the plasma density even at low field strength of 10 Gauss. In the deposition chamber, moreover, a rotatable holder 17 for substrates 18 is arranged, being connected to a rotation drive 19 that is lead in through the chamber wall, vacuum tight and insulated, in order to obtain a more uniform deposition by a rotational motion of the substrates. The substrate holder can be placed at positive or negative potential with the voltage source 20. FIG. 1 also shows vacuum seals 22 and 23 between the floor 8 or roof 24, respectively, and the cylindrical surface of the vacuum chamber.

In order to test the described layout, a cathode of pure titanium was used, and substrates 18 previously cleansed in the conventional manner in solvents with ultrasound were fastened to the substrate holder 17. After achieving a high vacuum, argon was introduced into the layout through the suction pipe 2 until a pressure of around $10^{-1}$ Pascals was achieved, thereby igniting the discharge with formation of cathode points on the cathode. At the same time, nitrogen was let in up to a pressure of 10 Pascals and this pressure was held constant during the subsequent deposition. The arc current was set at 250 amperes. After a deposition time of 8 minutes, a TiN layer of 2 micrometers is produced on the substrates mounted at distance of 30 cm. In a second example, for a test deposition in the same layout an identical procedure was followed, the only difference being that a larger arc current of amperes was established. Despite the current intensities of 400 amperes was established. Despite the current intensities of 250 or even 400 amperes, the arc in both cases burned steadily and no wandering from the cathode surface or any damage to parts of the layout was observed.

The arrangement of FIGS. 2-5 concern, as mentioned, geometrical variations of the limiting ring and various switching options.

In FIG. 2, the voltage for the limiting ring 14 arranged between the anode and the cathode 3 is obtained from a potentiometer 254 as part of the anode voltage provided by the voltage source 6. In this way, an optimal voltage can be established on the limiting ring for the particular instance, and it has been found that this should be half as large as the anode voltage. For the usual anode voltages of around 50 volts for low voltage arc discharges, a limiting ring voltage of around 25 volts therefore obtains. The limiting ring voltage is supplied through the voltage conduit 26 in the floor plate 8 of the layout.

The arrangement of FIG. 3 differs from that of FIG. 2 in that, although the limiting ring voltage is also supplied by the anode voltage source, it is reduced to an appropriate level in this circuit by means of an electrical resistance 27. This resistance should lie in the range of 1 Ohm. If a current of, say, 20 amperes then flows across the limiting ring, a voltage drop of 20 volts will be produced across resistance 27, so that a residual voltage of 30 volts will still be applied to the limiting ring if the arc voltage is 50 volts, as an example.

FIG. 4 shows a limiting ring 14 not connected to a voltage source, but instead, being supported by the insulator 4, it is charged to a positive potential during operation by virtue of being struck by ions from the arc discharge. Even such limiting ring placed at a floating potential also performs its function in the sense of the present invention. During the operation, a floating potential of the ring of approximately 15 volts was measured for an anode potential of 40 volts and an arc current of around 70 amperes.

FIG. 5 shows an arrangement with two limiting rings 14 and 14b, both of which rest on the insulator 4 as in FIG. 4. In this arrangement, no special anode 10 is used, the inner wall of the vacuum chamber taking on the function of the anode. The two limiting rings provide an even greater security against undesired flashover of the discharge in the region of the cathode rim, and it was possible to reliably master arc current intensities of more than 500 amperes in this way with no further provision. Such heavy-current arc discharge produces a large number of tracing points of the discharge, so that one more tracing points approach the cathode rim at each instant, but are reliably driven back by the double limiting ring 14a/14b. With the last described arrangement of FIG. 5, a layer of 15 mm was deposited from a titanium target, connected as the cathode, with an arc current intensity of 400 amperes, free of all disturbances. Without such limiting ring of the invention, on the other hand, strong disturbances occurred after depositing no more than fractions of a millimeter, as the cathode spot of the discharge races to the edge of the cathode and stays there. With the invention, this defect was not observed, even after hours of operation.

The copper ring also brings many times greater reliability in the task of limiting the motion of the cathode points to a designated region of the cathode surface as compared to the known use of a limiting ring of magnetically permeable iron (iron ring). In fact, compared to an iron ring, a trial operation with a current intensity producing more than twice the number of cathode points on the cathode of identical size resulted in no breakout of the discharge throughout the life time of one cathode, during which more than 1 cm thickness of material was removed. All that was necessary was to remove the layer of cathode material deposited on the copper each time after reaching a thickness of several millimeters.

While specific embodiments of the invention have been shown and described in detail to illustrate the application of the principles of the invention, it will be understood that the invention may be embodied otherwise without departing from such principles.

What is claimed is:

1. A cathode arrangement for vacuum evaporation apparatus, wherein evaporation is performed by at least one electric arc generated between an anode and a cathode of said arrangement, said arrangement comprising a bordering structure means, said bordering structure means bordering and extending above a surface area of said cathode which is to be evaporated by said electric arc, said bordering structure means being formed of substantially magnetically non-permeable material and having a conductivity along its surface of at last $3 \times 10^5$ S/cm, said bordering structure means not being part of an induction coil structure with at least two windings, said bordering structure means for reacting to and acting on said electric arc, prior to the arc leaving the cathode surface, by eddy currents, induced by said electric arc, within said bordering means extending above said surface area to maintain said electric arc within said preselected area of said cathode.

2. The arrangement of claim 1, said extending bordering structure means being formed, at least along said surface of one of copper and of aluminum.

3. The arrangement of claim 1, wherein said extending bordering structure means is a closed ring.

4. The arrangement of claim 1, wherein said extending bordering structure means is an annular disk.

5. The arrangement of claim 1, wherein said extending bordering structure means comprises a cylindric surface.

6. The arrangement of claim 1, said extending bordering structure means extends above said cathode area by an amount of no more than 20 mm.

7. The arrangement of claim 1, wherein said extending bordering structure means has a preselected electric potential.

8. The arrangement of claim 1, wherein said extending bordering structure means is provided with an electric tap means for establishing a predetermined voltage on said extending bordering structure means.

9. The arrangement of claim 1, wherein said extending bordering structure concentrically arranged structures distant from each other.

10. The arrangement of claim 1, wherein said extending bordering structure means is electrically isolated from said cathode and from said anode.

11. The arrangement of claim 1, wherein said extending bordering structure means is electrically isolated from said cathode by isolation means.

12. A vacuum evaporation apparatus with an arrangement according to claim 1, further comprising:
connection means connecting said anode to one electrical potential and connecting said cathode to another electrical potential, negative with respect to said one electrical potential, and an ignition finger having a positive potential movably mounted over said cathode and being engagable with said cathode.

13. A vacuum evaporation apparatus, comprising:
a cathode having a surface;
a ring-shaped disk anode surrounding said cathode;
conductive surface means positioned adjacent said cathode, said conductive surface means including a conductive limiting member of substantially magnetically non-permeable material having an extending surface extending above said surface of said cathode and having a conductivity of at last $3 \times 10^5$ S/cm for reacting to and acting on an arc generated between said anode and said surface of said cathode, prior to the arc leaving the cathode surface, by inducing small surface currents on said extending surface of the limiting member in response to the approach of an electric arc to produce a repellant magnetic field which builds up quickly due to the surface conductivity of said extending surface of the limiting member; and, electrical insulation means positioned between said limiting member and said cathode.

14. A vacuum coating device according to claim 13, including a power supply, a negative output thereof being connected to said cathode and a variable resistor in electrical connection with a positive output of said supply and said limiting member.

15. A vacuum coating according to claim 14, wherein said variable resistor has a resistance of greater than 1 ohm.

16. A vacuum coating device according to claim 13, including an insulator disposed on a wall of a housing, said cathode and said limiting member being mounted on said insulator in spaced relationship.

17. A vacuum coating device according to claim 13, wherein said limiting member comprises an annular member having a flange at its upper end extending above said cathode surface.

18. A vacuum coating device according to claim 13, wherein there are two limiting rings, one arranged within the other and both being spaced outwardly of said cathode.

19. A method for maintaining an electric arc on a preselected area of a cathode in a vacuum evaporation process, comprising the steps of:
   positioning a non coil limiting ring of substantially magnetically non-permeable material about the cathode, extending above said preselected area of said cathode;
   generating eddy currents in the limiting ring extending above said arc, rising in magnitude, as the arc approaches the limiting ring so as to repel the approaching arc; and
   minimizing the magnitude of the time for generating the rising magnitude eddy currents for providing the limiting ring extending above said arc with a surface having a conductivity of at least $3 \times 10^5$ S/cm such that a rising magnitude time of said eddy currents is adapted to the migration speed of said arc on the cathode and adapted to the approaching speed of said arc to said limiting ring extending above said arc.

20. In a method of maintaining an electric arc which generates a magnetic field on a predetermined area of a cathode in a vacuum evaporation process in which method there is generated, in a structure at the periphery of said area, a current which generates a repelling magnetic field, repelling said electric arc as it approaches said structure at the periphery of said area, the improvement comprising generating said electric current as eddy electric currents in an electrically conductive surface of said structure extending above said area of said cathode, being formed of substantially magnetically, non-permeable material by said magnetic field of said arc itself, said eddy currents generating said repelling magnetic field, whereby said magnetic field of said arc generating rising eddy currents as it approaches said surface extending above said area of said cathode, said rising eddy currents thus providing for a rising repelling magnetic field, so as to increasingly prevent said arc to leave said predetermined area as it approaches said surface extending above said area of said cathode and adapting the rise time of said eddy currents to the approach time of said arc by providing said structure with a surface conductivity of at least three times $10^5$ S/cm.

21. In a cathode arrangement in a vacuum evaporation apparatus, wherein evaporation is performed by at least one electric arc generated between an anode and a cathode of said apparatus and comprising an arc repelling arrangement by which there is generated an electric current producing a magnetic field which repels said arc into a predetermined area of said cathode, the improvement comprising providing as said arc repelling arrangement, an electrically conductive substantially magnetically non-permeable structure bordering said area and extending above said area, so that said arc automatically induces an electric current within said structure as said current generated by said arc repelling arrangement when said arc approaches said structure, said electrically conductive structure having a surface conductivity of at least three times $10^5$ S/cm to provide for a rise time of said automatically induced electric current adapted to the approach time of said arc approaching said structure.

22. In a method for preventing an electric arc of an electric arc discharge from migrating beside a predetermined area of a cathode arrangement in a vacuum evaporation process, in which method there is provided a bordering structure of electrically conductive material arranged around said predetermined area of said discharge back on said predetermined area once it has left said predetermined area, the improvement of selecting the surface conductivity of said structure to be at least $3 \times 10^5$ S/cm and repelling by said structure with said surface conductivity said arc already as it approaches the periphery of said predetermined area before it leaves said predetermined area so that said arc remains on that predetermined area.

* * * * *